United States Patent
Le Guilloux et al.

(10) Patent No.: US 11,132,475 B2
(45) Date of Patent: Sep. 28, 2021

(54) METHOD OF NON-DESTRUCTIVE CHECKING OF A COMPONENT FOR AERONAUTICS

(71) Applicant: SAFRAN, Paris (FR)

(72) Inventors: Yann Le Guilloux, Moissy-Cramayel (FR); Benoit Vincent Pierre Lasjaunias, Moissy-Cramayel (FR); Vincent Jerome Morard, Moissy-Cramayel (FR); Estelle Parra, Moissy-Cramayel (FR)

(73) Assignee: SAFRAN, Paris (FR)

( * ) Notice: Subject to any disclaimer, the term of this patent is extended or adjusted under 35 U.S.C. 154(b) by 710 days.

(21) Appl. No.: 15/778,114

(22) PCT Filed: Nov. 24, 2016

(86) PCT No.: PCT/FR2016/053082
§ 371 (c)(1),
(2) Date: May 22, 2018

(87) PCT Pub. No.: WO2017/089714
PCT Pub. Date: Jun. 1, 2017

(65) Prior Publication Data
US 2018/0314786 A1 Nov. 1, 2018

(30) Foreign Application Priority Data
Nov. 24, 2015 (FR) ................................. 1561301

(51) Int. Cl.
*G06G 7/48* (2006.01)
*G06F 30/15* (2020.01)
(Continued)

(52) U.S. Cl.
CPC .............. *G06F 30/15* (2020.01); *G06F 30/20* (2020.01); *G06T 7/001* (2013.01); *G06T 7/30* (2017.01);
(Continued)

(58) Field of Classification Search
CPC ......... A61B 6/032; A61B 34/20; A61B 3/102; A61B 34/10; A61B 6/504;
(Continued)

(56) References Cited

U.S. PATENT DOCUMENTS 8,620,055 B2 * 12/2013 Barratt .................... G06T 7/344
382/131
2008/0259072 A1 * 10/2008 Blumhofer ................ G06T 7/33
345/419
(Continued)

FOREIGN PATENT DOCUMENTS

WO WO 2011/015822 A1 2/2011
WO WO 2015/074158 A1 5/2015

OTHER PUBLICATIONS

Kruth et al. Computed Tomography For Dimensional Metrology, CIRP Annals Manufacturing Technology 60 (2011) pp. 821-842 (Year: 2011).*
(Continued)

*Primary Examiner* — Rehana Perveen
*Assistant Examiner* — Cuong V Luu
(74) *Attorney, Agent, or Firm* — Oblon, McClelland, Maier & Neustadt, L.L.P.

(57) ABSTRACT

A method of non-destructive checking of a component for aeronautics, the method including the following steps of acquiring a volume by tomographic imaging, of generating by computer simulation a surface corresponding to the component to be analyzed, of registering the volume and the surface by optimizing a similarity criterion defined by a
(Continued)

Figure 1:
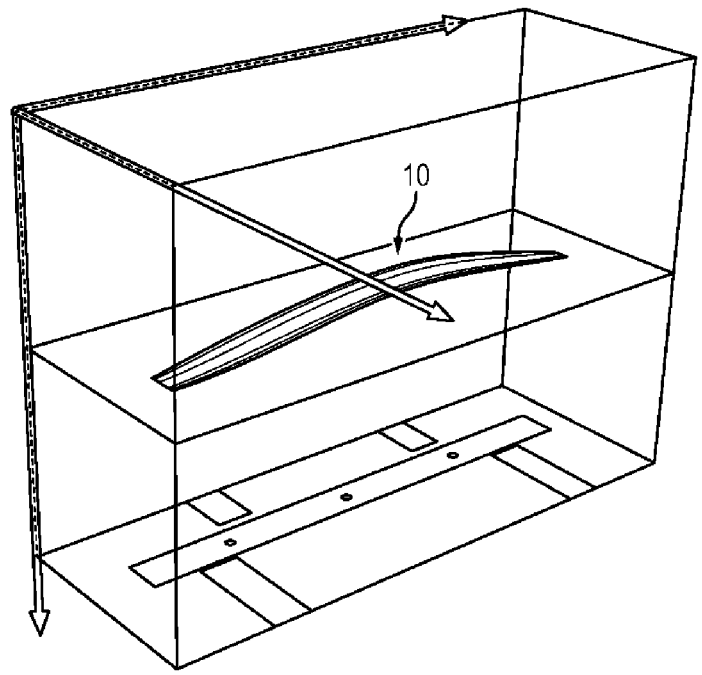

function taking into account the correlation between normal vectors of a field of normal vectors of the surface displaced by transformation and a gradient of a gradient field of the volume, the optimization being performed as a function of transformations for determining the optimal transformation which maximizes the similarity criterion, of storing the optimal transformation, of establishing the correspondence between the surface and the volume obtained with the aid of the optimal transformation.

13 Claims, 3 Drawing Sheets

(51) Int. Cl.
    *G06T 7/30*     (2017.01)
    *G06T 7/00*     (2017.01)
    *G06F 30/20*     (2020.01)
    *G06T 11/00*     (2006.01)

(52) U.S. Cl.
    CPC .. *G06T 11/008* (2013.01); *G06T 2207/10081* (2013.01); *G06T 2207/30164* (2013.01)

(58) Field of Classification Search
    CPC .............. A61B 2034/105; A61B 6/466; A61B 2034/107; A61B 8/483; A61B 5/0073; A61B 90/37; G06T 2207/10081; G06T 15/08; G06T 2207/10072; G06T 19/003; G06T 7/74; G06T 15/00; G06T 7/30; G06T 11/008; G06T 7/001; G06K 9/00; G06F 30/15
See application file for complete search history.

(56) References Cited

U.S. PATENT DOCUMENTS

2012/0155734 A1    6/2012    Barratt et al.
2016/0275703 A1    9/2016    Mariampillai et al.

OTHER PUBLICATIONS

Dirk Bartz Large Model Visualization: Techniques and Applications 2001 (Year: 2001).*
International Search Report dated Feb. 2, 2017 in PCT/FR2016/053082 (with English translation of Category of Cited Documents), citing documents AO, AP and AW through AZ therein, 11 pages.
French Search Report dated Aug. 8, 2016 in French Patent Application No. 1561301 (with English translation of Category of Cited Documents), citing documents AO, AP and AW through AZ therein, 11 pages.
Becker, B., et al., "Computer Tomography has arrived in automated inspection processes, combining material and geometry analyses", 18$^{th}$ World Conference on Non-Destructive Testing, Retrieved from the internet: URL: http://www.ndt.net/article/wcndt2012/papers/306_wcndtfinal100306.pdf , Apr. 2012, 9 pages.
Malik, M.M., et al., "Computation and Visualization of Fabrication Artifacts", Journal of WSCG, Retrieved from the internet: URL: http://publik.tuwien.ac.at/files/PubDat_179643.pdf, XP055290485, Jan. 1, 2009, p. 17-24.
Hu, Y. et al., "MR to Ultrasound Image Registration for Guiding Prostate Biopsy and Interventions", Medical Image Computing and Computer-Assisted Intervention—MICCAI 2009, XP019130396, Sep. 20, 2009, pp. 787-794.
Shammaa, M.H., et al., "Registration of CAD mesh models with CT volumetric model of assembly of machine parts", The Visual Computer, International Journal of Computer Graphics, vol. 23 No. 12, XP019562390, Aug. 8, 2007, pp. 965-974.

* cited by examiner

METHOD OF NON-DESTRUCTIVE CHECKING OF A COMPONENT FOR AERONAUTICS

GENERAL TECHNICAL FIELD

The invention relates to the field of non-destructive checking (CND) of industrial parts, particularly in the field of aeronautics, using digital tomographic volumes for example.

More precisely, the invention relates to the registration of these volumes on models created on a computer.

CND is essential for checking the material integrity of materials. For example, fan blades which are made of three-dimensionally woven carbon fiber composites, are critical parts which must be checked in full. But the fan casing, the straightener, the airfoils, the blades, etc. can also be concerned.

The digital tomographic volumes are obtained with the aid of a tomograph, of which the X-ray generator emits a beam passing through the part to be explored, before being analyzed after attenuation, by a detection system. The intermediate image thus obtained is called a "projection." By acquiring a plurality of projections in different planes of space (with a possible pretreatment) and recombining them, a three-dimensional volume of the part is obtained with a value of the X-ray absorption density at each voxel.

These volumes allow non-destructive access to the interior of the part. Nevertheless, depending on the shape of the part, the energy can be fairly weak and ultimately the volume can be poorly defined in certain places (concave shapes for example, where the gradient is small).

Other imaging technologies are possible for obtaining such volumes.

Models created on computer are obtained by Computer Aided Design (CAD): these are sets of surfaces or parametric curves allowing a part to be described theoretically.

The CAD of the part is meshed for example by a set of cells forming a three-dimensional surface.

Hereafter in the description, reference will be made to volumes obtained by tomography.

The design offices in charge of the parts previously mentioned define critical zones and/or analysis zones which are defined in the CAD frame of reference.

However, as the tomographic volume and the CAD model each have their own frame of reference (see FIGS. 1 and 2), it is necessary to know the transform allowing the transition from one frame of reference to the other to be able to know the exact position of information located in the tomographic volume or the CAD model. These methods are called "registration" methods.

Registration therefore seeks to create the best coincidence between the CAD model and the tomographic volume. In fact, the CAD model is less heavy (in terms of computer processing) to move. In addition, interpolation problems prompt the movement from the CAD model to the tomographic volume. The inverse transform (from the tomographic location to the CAD location) can then be deduced.

Designated t is a transform allowing the location to be changed between the CAD surface and the tomographic volume, t belonging to the transformation space T. In particular, the transformation is sought that allows passing from the CAD location to the tomographic location.

In the space T of rigid transforms, t depends on six parameters (the three translations and the three rotations in space). On the other hand, in the space T of elastic transforms, T can have a higher dimension.

During registration, a similitude criterion is used that needs to be maximized (or to minimize a dis-similarity criterion; hereafter it will be assumed that it is desired to maximize a similitude criterion). The similitude criterion comprises as an input the tomographic volume and the transform t(CAO) of the CAD model by the transform t. Hereafter, the similitude will be referred to in the form S(t(CAO), volume).

The similitude criterion is selected so that it is maximum when the transform t is that which optimizes registration. To this end, it is necessary that the similitude criterion be continuous, differentiable and have no local maxima other than the overall maximum in the vicinity of the initial registration.

Thus, the optimization criterion is the maximization of the defined similitude.

The optimization problem can be described in the following manner, with $t_{opt}$ being the optimal transform:

$$t_{opt} = {}^{arg\,max}_{t \in T}[S(t(CAO), \text{volume})]$$

PRIOR ART

There are different methods for carrying out registration.

One known method consists of extracting the contour of the part in the tomographic volume to obtain a surface from a three-dimensional surface. What follows is a known method of registration with the CAD surface, after having meshed the surface obtained from the tomographic volume.

Nevertheless, this method has limitations.

The accuracy depends on the accuracy of extraction of the contour of the part. However, certain zones of the part have a very low energy, which causes poorly-localized contours. This inaccuracy also recurs in the meshing step.

To these two sources of inaccuracy is added the uncertainty inherent in traditional registration methods.

In addition, this method applies the same weight to all the zones of the part, regardless of its shape. For example, poorly defined zones and/or those of less interest are taken as fully into account as more detailed convex edges, for the registration step.

PRESENTATION OF THE INVENTION

Consequently, a method which allows the aforementioned disadvantages to be mitigated is desired.

The invention proposes a non-destructive checking method for an aeronautical part, the method comprising the following steps consisting of:
  acquisition by tomographic imaging of a volume corresponding to a part to be analyzed,
  generation by computer simulation of a surface corresponding to the part to be analyzed,
  calculation of a field gradient of the volume and generation of a field of normal vectors to said surface,
  registration of the volume and of the surface optimizing a similitude criterion defined by a function taking into account the correlation between normal vectors of the field of normal vectors of the surface displaced by a transform and the field gradient of the volume gradient, said optimization being performed according to the transforms to determine the optimal transform which maximizes the similitude criterion,
  storing the optimal transform in memory,
  establishing the correspondence between the surface and the volume using the optimal transform, the steps consisting of registration, storage in memory and establishing the correspondence being implemented by a computing unit comprising data processing means.

While it is known to compare a volume with another volume or a surface with another surface, the invention resorts to an intermodal volume/surface registration method which allows dispensing with the limitations of the prior art. For this purpose, an original criterion of similitude between two heterogeneous objects is presented, based on the correlation of the normals to the CAD surface with the gradients of the volume.

By using a volume field gradient calculation, the extraction of the surface of the volume and the calculation of normal vectors to this surface are dispensed with.

The comparison of the gradient on the tomographic surface with the normal to the surface allows a link to be established between the two modes. The calculation, for example, of a function of scalar products of the two vector fields allows obtaining a similitude function very resistant to noise and therefore very accurate.

A method is therefore obtained which does not accumulate errors in extracting the contour and in meshing the contour.

Preferably, the volume is obtained by X-ray tomography.

Advantageously, the invention comprises the following characteristics, taken alone or in combination:
- the surface comprises a meshing composed of cells wherein the normal vectors are defined with respect to said cells,
- the volume gradient is defined as a function of the density of voxels forming said volume,
- the similitude criterion uses a function of scalar products between the normals of the surface and the volume gradients at the points considered,
- the function is a sum of the scalar products,
- the function is a quadratic sum of the scalar products,
- the method comprises a step consisting of pre-registering using data originating in an acquisition of the volume the pre-registering step being performed after the steps consisting of acquiring the volume and generation of the surface, but before the registration step,
- the pre-registering step associates with each normal vector to the surface a volume vector gradient associated with a voxel or a plurality of voxels, the two vectors forming a vector couple, and wherein the similitude criterion of the registration step takes into account the correlation between the two vectors of the couple,
- the part is a part designed to equip an aircraft.

PRESENTATION OF THE FIGURES

Figure 2:
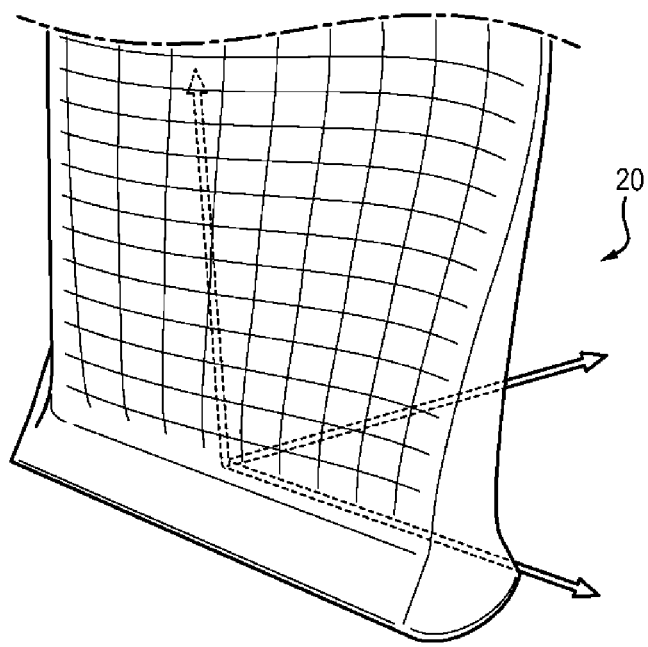
Figure 3:
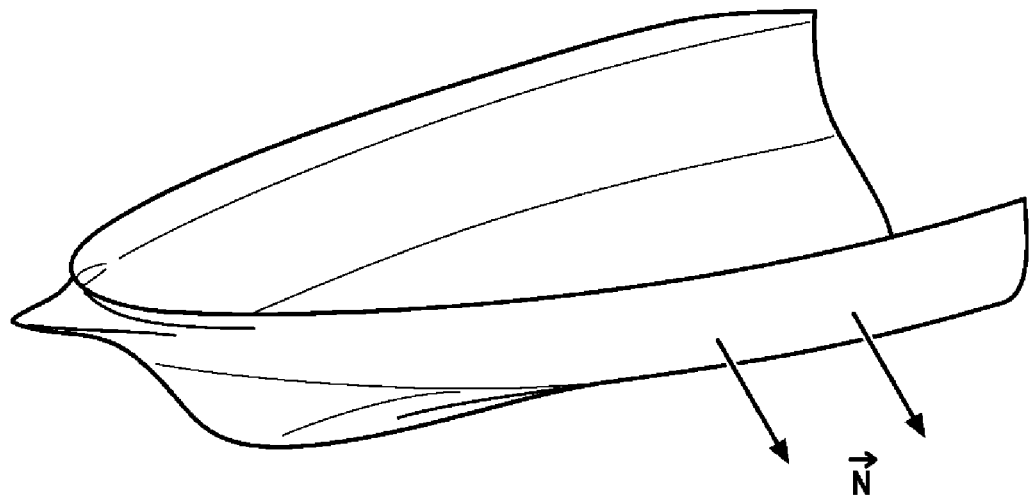
Figure 4A:
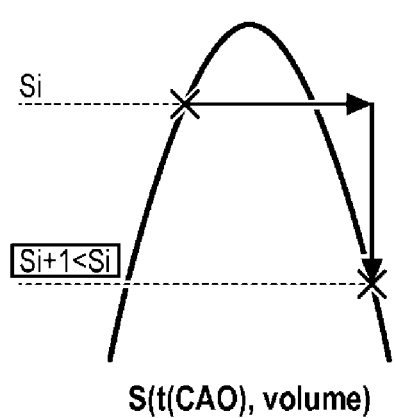
Figure 4B:
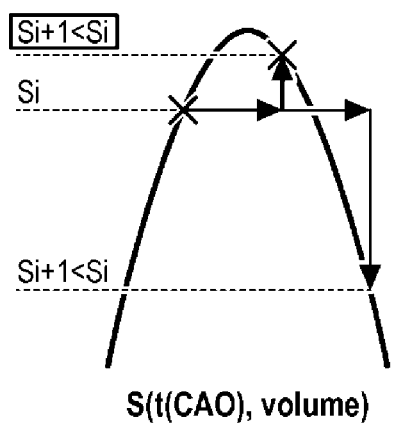
Figure 5:
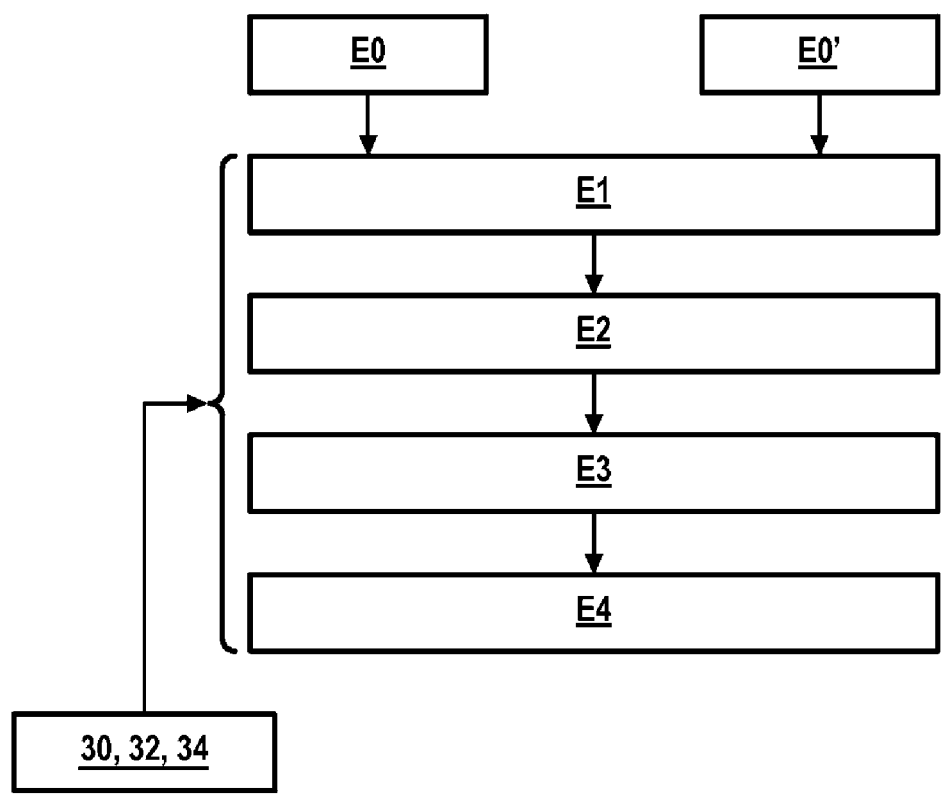

Other features, aims and advantages of the invention will be revealed by the description that follows, which is purely illustrative and not limiting, and which must be read with reference to the appended drawings, on which:

FIG. 1 shows a tomographic view of a blade, in which the origin of the location is situated in the upper left corner, FIG. 2 shows a view produced by computer assisted design (CAD) of a blade, where the origin of the location is situated in the middle of the blade at the end of the span, FIG. 3 shows normal vectors on a part simulated by CAD, FIGS. 4a and 4b shows illustrations of a registration optimization algorithm, FIG. 5 shows a diagram symbolizing different steps occurring in the overall non-destructive checking process according to an embodiment of the invention.

DETAILED DESCRIPTION

The method described here allows checking a digital tomographic volume 10 obtained by X-ray tomography of a part (FIG. 1) and of a CAD model 20 in the form of a surface (FIG. 2) obtained by digital simulation of the same part. This method comprises registration between the volume and the surface transformed by a transform t of which the optimum $t_{opt}$ is sought.

FIG. 5 shows certain steps schematically.

This typically involves a part designed for the aeronautical industry.

The method applies to any type of three-dimensional volume obtained by other imaging technologies, for which a field gradient can be calculated (see below).

The objective of registration is to obtain the optimum transform $t_{opt}$ allowing the volume 10 to coincide as closely as possible with the surface 20.

A preliminary step E0 to any registration method consists of acquiring the tomographic volume using a tomographic imaging device. Another preliminary step E0' consists of generating the CAD surface 20 by computer methods, using computation means. The CAD surface 20 thus generated is oriented.

The registration process, presented in the introduction, is carried out by a computing unit 30 comprising data processing means 32. For example, the computing unit 30 is a personal computer or a suitable calculator, and the data processing means 32 are processors. The computing unit 30 can serve to generate the CAD surface 20.

The registration process comprising in particular two main steps E1 and E2.

If necessary, it is possible to define an intermediate step of reception by the computing unit 30 of the volume 10 and of the surface 20.

A first main step E1, called pre-registration, consists of a rough initialization of the registration and the second main step E2 consists of the optimization of said registration. In fact, the registration algorithm application is not always relevant if the extremum is not in proximity. Following this pre-registration step, the superposition is in the vicinity of the optimum, which allows a registration optimization method to then be applied.

The first step E1 is typically carried out thanks to the set of system data supplied by the tomograph. During the acquisition of the data, the assembly geometry (distance between the tomography tube and the detector, between the tube and the part, the corners, etc.) and the set of parameters linked with reconstruction are provided. This registration initialization is known to a person skilled in the art and will not be detailed here. Following this first step E1, the tomographic volume 10 and the CAD surface 20 are relatively positioned with respect to one another and the registration is near optimum.

The second step E2 is carried out using a similitude criterion S as presented in the introduction.

For each transform t, a value is obtained of the similitude S(t(CAO), volume).

As indicated in the introduction, this involves optimizing the transform t to obtain an overall maximum of the similitude criterion S.

In order to take into account both the tomographic volume 10 and the CAD surface 20, the similitude criterion S is founded on a function expressing the correlation between the normal vectors N of the transformed (by the transform t) surface 20 t(CAO) and tomographic volume gradients 20, at the points considered (see FIG. 3). Consequently, even if the input data consist of a volume and a surface, the method uses gradients and normal vectors which are homogeneous data which can be combined to obtain a functional similitude criterion (i.e. the identifiable local maximum is relevant).

Prior to the step E2 of registration per se, the method thus comprises a step E01 consisting of calculating a field gradient on the tomographic volume 10 and a step E01' of generating a normal vector field on the surface 20. The calculation of the field gradient on the tomographic volume allows bypassing the step of extracting the surface of said volume, and its related inaccuracies. The steps are implemented by a computing unit, typically the unit 30.

The normal vector N field of the CAD surface 20 is described by point/normal vector pairs at each point considered. For each point considered, this point/normal vector pair is transformed by the transform t in the reference frame of the tomographic volume 10 and associated with the corresponding gradient in this (preferably pre-calculated) reference frame. The correlation is then performed.

For voxels situated on the surface of the object, the gradient of the tomographic volume 10 is orthogonal to the surface of the object and, in the case of an ideal superposition, the two vector fields, that of the normals to the surface of the CAD model and that of the gradients of the tomographic volume at the corresponding points, are congruent. However, as a normal vector field (and therefore a field gradient) characterizes a surface, the superposition of the fields makes it possible to ensure that the transformed surface 20 t(CAO) is superimposed on the volume 10.

In the case of a meshing 22 composed of cells 24, the normal vectors N are defined with respect to the cells 24 of the meshing 22. The cells 24 of the meshing 22 are preferably flat polygons, and more particularly triangles. In the case of a flat polygon, the normal vector is conventionally defined as a vector extending orthogonally toward the exterior from the flat surface of said cell.

The similitude criterion S thus takes into account the normal vector N at a considered point, that is at a cell 24 of the meshing 22 associated with the gradient defined for a corresponding zone of the volume 10 (for example a voxel or a plurality of nearby voxels). A gradient/normal vector couple is thus defined for each point considered (i.e. each portion) of the transformed CAD surface 20 t(CAO) which was previously substantially superimposed with little accuracy during the step E1 (when in the vicinity of the maximum value of the similarity criterion).

If the transformed CAD surface t(CAO) is superimposed (exactly or quasi-exactly) on the volume 10, all these vector couples are collinear. Consequently, the similarity criterion S must be maximum when all these vector couples are collinear.

For that purpose, in a preferred embodiment, the correlation of the similitude criterion X is defined by a scalar product between the normal vectors N and the gradients of each vector couple considered. It is typically possible to sum the set of scalar products.

An example of a function for the similitude S is a sum, or a quadratic sum, of scalar products on the set of points considered, i.e. the square of the scalar products of the gradient/normal vector couples considered is summed.

A similitude involving a function of the cosine of the angle between the vector couple is assimilated here to a scalar product.

A scalar product being maximum when the two vectors are collinear and in the same direction, it is easily understood that the similitude S is maximum when all the vector couples are collinear and in the same direction, that is when the surface 20 is superimposed on the volume 10.

The three components of the gradient of the volume 10 are calculated from the differences of absorption density between different voxels of the volume 10 along the three axes.

In addition, the method intrinsically attributes greater importance to the zones with a strong gradient of the part. In fact, the greater the gradient, the more weight it will have in the summation of the set of scalar products of the vector couples. This is a measure of robustness, because stronger gradients are better defined and more stable.

Alternatively, if it is desired to attribute the same weight to all the zones of the part, it is sufficient to normalize the gradients (and the normal vectors if they are not normalized) before applying the similitude criterion presented previously.

The similitude criterion presented above allows a similitude value to be obtained for each transform t. The registration process then uses refining steps of this similitude criterion depending on the transform t.

The first value of the similarity criterion S calculated to begin the optimization is that of the transformation which results from the pre-registration step E1.

In the case of rigid transforms, it is recalled that a transform t as previously defined is described by 6 parameters: the three translations and the three rotations in space.

The maximization (or minimization) of the similitude can be accomplished by different algorithms.

In particular, similitude involves the gradient of the volume, its spatial derivative therefore involves the second derivative of the volume, namely its Hessian. After having calculated the Hessian of the volume at each point, it is possible for example to use an increasing gradient algorithm to maximize the similitude and to deduce from it the optimal transformation.

The gradient of the similitude with respect to the modification of transforms t has dimension 6 (variations for the three rotations and for the three translations).

Displacement therefore occurs in the direction of this gradient having the greatest (positive) slope of variation (in the space tangent to that of the transforms).

FIGS. 4a and 4b symbolize this method. At the ordinate is shown the value of the similitude S and at the abscissa is shown the direction of the gradient having the greatest slope of variation of the similitude.

Between each calculation of the value of the similitude, the transform t is modified by a certain value called a "pitch." The "pitch" is typically a vector with six coordinates corresponding to a given displacement and a given rotation in space. The index i refers to iterations.

The method is therefore the following:

E21: Calculation of the value of the similitude for a transform ti: S(ti(CAO), volume), denoted $S_i$ in FIGS. 4a and 4b, E22: Calculation of the value of the similitude for a transform $t_{i+1}$ incremented by the pitch: $S(t_{i+1}(CAO),$ volume), denoted $S_{i+1}$ in FIGS. 4a and 4b, E23: comparison of values:
  if $S(t_{i+1}(CAO),$ volume)$>S(t_i(CAO),$ volume), then step E22 is repeated based on the new transform $t_{i+1}$,
  if $S(t_{i+1}(CAO),$ volume)$<S(t_i(CAO),$ volume), then a new lower value is attributed to the pitch and the step E22 is performed based on the transform $t_i$ incremented by the new pitch.

For example, the new value of the pitch corresponds to the pitch divided by two.

Repetition of step E21 is furthermore not necessary because the value has already been calculated during a previous occurrence of the step.

If the pitch becomes lower than a selected threshold, the algorithm stops.

Likewise, if the value of the similitude does not change sufficiently, the algorithm stops. It is then assumed that the optimal transform $t_{opt}$ has been found.

The criteria for stopping or modifying the algorithm can be adjusted as needed.

Other methods exist for optimizing the similitude criterion:
Levenberg Marquardt algorithm,
Broyden-Fletcher-Goldfarb-Shanno,
Fletcher-Reeves,
Polaak-Robiere.

Following the optimization step E2, the optimum transform $t_{opt}$ is stored in memory in a step E3. For this purpose, the computation unit is provided with a memory 34.

Finally, in a step E4, thanks to the optimum transform, it is possible to establish a correspondence between the volume 10 and the surface 20. The step E4 can comprise the calculation of the inverse of the optimum transform, so as to obtain the inverse optimum transform, i.e. the transform that allows the volume 10 to be superimposed on the surface 20.

Thanks to this correspondence between the CAD surface 20 and the volume obtained by imaging the real part, it is possible to carry out accurate checks on the material integrity of the part.

The invention claimed is:

1. A non-destructive method of analyzing an aeronautical part for defects, the method comprising:
   acquiring, by tomographic imaging, a volume corresponding to the part,
   generating, by computer simulation performed by processing circuitry, a surface corresponding to the part,
   calculating, by the processing circuitry, a field gradient of the acquired volume and generating a field of normal vectors to the surface,
   registering, by the processing circuitry, the volume and the surface by optimizing a similitude criterion defined by a function taking into account a correlation between (1) the normal vectors of the field of normal vectors to the surface displaced by a transform, and (2) gradients of the field gradient of the volume, the optimization being accomplished by determining an optimal transform that maximizes the similitude criterion,
   performing an inverse of the optimal transform to generate the inverse optimal transform,
   superimposing the volume on the surface using the inverse optimal transform, and
   identifying material defects of the part based on a correspondence between the surface and the volume.

2. The method according to claim 1, wherein the surface comprises a meshing composed of cells and the normal vectors are defined with respect to the cells.

3. The method according to claim 1, wherein the field gradient of the volume is defined as a function of a density of voxels forming the volume.

4. The method according to claim 1, wherein the similitude criterion is calculated using a particular function of scalar products between the normal vectors to the surface and the gradients of the volume.

5. The method according to claim 4, wherein the particular function is a sum of the scalar products.

6. The method according to claim 4, wherein the particular function is a quadratic sum of the scalar products.

7. The method according to claim 1, further comprising a pre-registration step using data originating in an acquisition of the volume, the preregistration step being performed after the volume acquiring step and the surface generating step, but before the registering step.

8. The method according to claim 7, wherein the pre-registration step further comprises associating, with each normal vector of the field of normal vectors of the surface, a particular vector gradient of the volume associated with a voxel or a plurality of voxels, and
   wherein the similarity criterion of the registering step takes into account the correlation between the normal vector and the particular vector.

9. The method according to claim 1, wherein the aeronautical part is a part of an aircraft.

10. The method of claim 1, wherein the step of generating the field of normal vectors comprises generating, at each point of a plurality of points on the surface, a point-normal vector pair, and
    the registering step comprises transforming, using the transform, the point-normal vector pair into a reference frame of the volume and associating the transformed point-normal vector with a corresponding gradient vector of the field gradient in the reference frame.

11. The method of claim 1, wherein, in the optimizing, portions of the volume having larger gradients are weighted higher than other portions of the volume having smaller gradients.

12. The method of claim 1, further comprising determining an initial value of the similitude criterion using an initial transform resulting from an initial registration of the volume and the surface.

13. The method of claim 1, further comprising storing, in a memory, the determined optimal transform.

* * * * *